US009680036B2

(12) United States Patent
Merchant et al.

(10) Patent No.: US 9,680,036 B2
(45) Date of Patent: *Jun. 13, 2017

(54) ORGANOMETALLIC AND HYDROCARBON ADDITIVES FOR USE WITH ALUMINUM BACK SOLAR CELL CONTACTS

(75) Inventors: Nazarali Merchant, San Diego, CA (US); Aziz S. Shaikh, San Diego, CA (US); Chandrashekhar S. Khadilkar, Broadview Heights, OH (US); Srinivasan Sridharan, Strongsville, OH (US); Hong Jiang, Irvine, CA (US)

(73) Assignee: Heraeus Precious Metals North America Conshohocken LLC, West Conshohoken, PA (US)

( * ) Notice: Subject to any disclaimer, the term of this patent is extended or adjusted under 35 U.S.C. 154(b) by 1216 days.

This patent is subject to a terminal disclaimer.

(21) Appl. No.: 13/342,231

(22) Filed: Jan. 3, 2012

(65) Prior Publication Data
US 2012/0186647 A1 Jul. 26, 2012

Related U.S. Application Data

(60) Provisional application No. 61/430,207, filed on Jan. 6, 2011.

(51) Int. Cl.
H01L 31/18 (2006.01)
H01L 31/0224 (2006.01)

(52) U.S. Cl.
CPC ...... H01L 31/022425 (2013.01); H01L 31/18 (2013.01); Y02E 10/50 (2013.01)

(58) Field of Classification Search
CPC .......................................................... H01L 31/18
USPC ............................................................ 438/98
See application file for complete search history.

(56) References Cited

U.S. PATENT DOCUMENTS

| 7,727,424 | B2* | 6/2010 | Konno .......................... 252/514 |
| 7,771,623 | B2* | 8/2010 | Young et al. ................. 252/512 |
| 8,236,598 | B2* | 8/2012 | Khadilkar et al. .............. 438/72 |
| 8,252,204 | B2* | 8/2012 | Carroll et al. ................ 252/514 |
| 8,309,844 | B2* | 11/2012 | Merchant et al. ............. 136/256 |
| 8,575,834 | B2* | 11/2013 | Wada et al. ................... 313/504 |
| 8,709,862 | B2* | 4/2014 | Jiang et al. .................... 438/98 |
| 8,815,636 | B2* | 8/2014 | Khadilkar et al. .............. 438/98 |
| 2006/0102228 | A1* | 5/2006 | Sridharan et al. ............. 136/256 |
| 2006/0289055 | A1* | 12/2006 | Sridharan et al. ............. 136/252 |
| 2009/0056798 | A1* | 3/2009 | Merchant et al. ............. 136/256 |
| 2009/0101190 | A1* | 4/2009 | Salami et al. ................ 136/244 |
| 2010/0163101 | A1* | 7/2010 | Kumar et al. ................ 136/256 |
| 2010/0173446 | A1* | 7/2010 | Khadilkar et al. .............. 438/72 |
| 2010/0180948 | A1* | 7/2010 | Lai et al. ...................... 136/261 |
| 2011/0146776 | A1* | 6/2011 | Carroll et al. ................ 136/256 |

(Continued)

Primary Examiner — Earl Taylor
(74) Attorney, Agent, or Firm — Blank Rome LLP; Charles R. Wolfe, Jr.; Jamie B. Tesfazion

(57) ABSTRACT

A method of reducing bow and/or improving the electrical performance of an aluminum back contacted silicon solar cell includes applying to a silicon wafer substrate a paste including aluminum and an organometallic compound, and firing the substrate. The organometallic compound is a $C_1$ to $C_{30}$ organometallic compound of a metal selected from the group consisting of Ag, Al, Ba, Bi, Ca, Co, Cr, Cu, Fe, K, Li, Mg, Mn, Mo, Na, Nd, Ni, Sb, Si, Sn, Sr, Ta, V, Zn, Zr. A paste is formed having an exothermic reaction peak at a temperature of at least 300° C. to less than 660° C.

11 Claims, 1 Drawing Sheet

(56) References Cited

U.S. PATENT DOCUMENTS

| | | | |
|---|---|---|---|
| 2011/0232747 A1* | 9/2011 | Mikeska et al. | 136/256 |
| 2012/0031484 A1* | 2/2012 | Matsuno et al. | 136/256 |
| 2012/0152342 A1* | 6/2012 | Roelofs | 136/256 |
| 2012/0174974 A1* | 7/2012 | Khadilkar et al. | 136/256 |
| 2012/0178207 A1* | 7/2012 | Jiang et al. | 438/98 |
| 2012/0186647 A1* | 7/2012 | Merchant et al. | 136/256 |
| 2012/0270366 A1* | 10/2012 | Khadilkar et al. | 438/98 |

\* cited by examiner

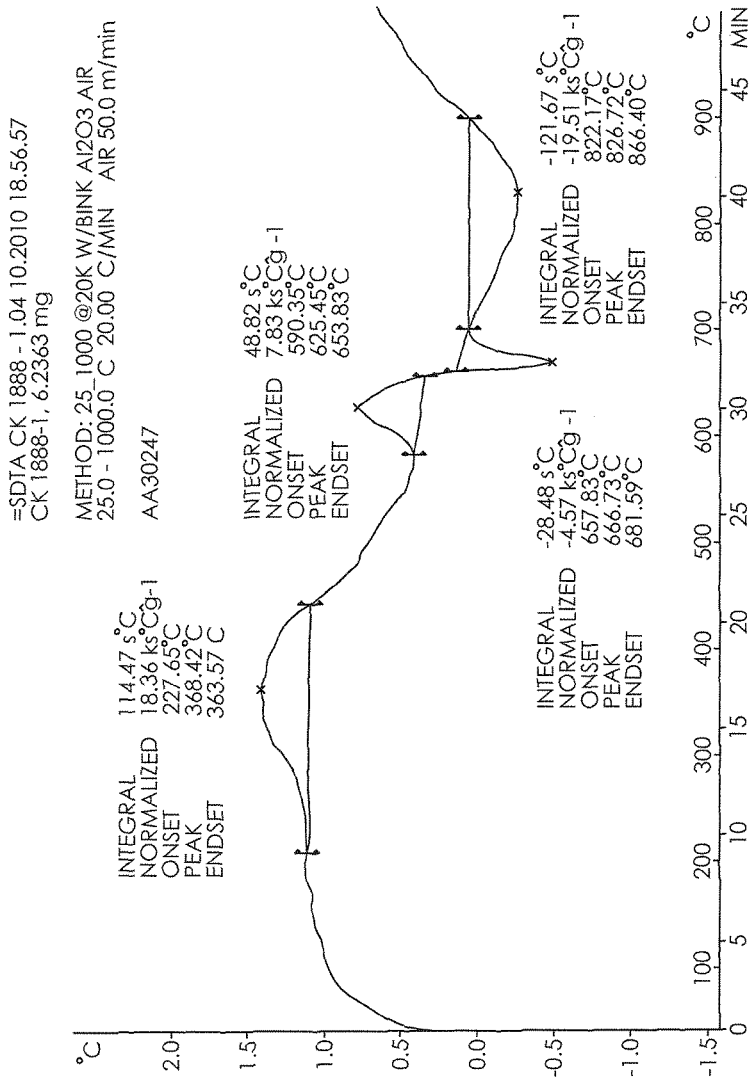

US 9,680,036 B2

ORGANOMETALLIC AND HYDROCARBON ADDITIVES FOR USE WITH ALUMINUM BACK SOLAR CELL CONTACTS

FIELD OF THE INVENTION

This invention relates to organometallic and hydrocarbon resin additions to back contact aluminum pastes that reduces wafer bowing as well as improves the electrical performance of a contact made from a fired paste. Certain organometallics and hydrocarbon resins act as anti sintering aids, reducing Al to Al sintering, and leading to reduced bowing of fired cells. Further, they react exothermically with aluminum or aluminum alloys or glass fits in a back contact film that lead to increase wafer temperature that ensures more reliable and uniform back contact formation.

BACKGROUND

Solar cells are generally made of semiconductor materials, such as silicon (Si), which convert sunlight into useful electrical energy. A solar cell contact is in generally made of thin wafers of Si in which the required pn junction is formed by diffusing phosphorus (P) from a suitable phosphorus source into a p-type Si wafer (for example boron doped Silicon wafer) to form n-type region. The side of the silicon wafer on which sunlight is incident (n-side) is generally coated with an anti-reflective coating (ARC) to prevent reflective loss of sunlight. This ARC increases the solar cell efficiency. A two dimensional electrode grid pattern known as a front contact makes a connection to the n-side of silicon, and a coating of predominantly aluminum (Al) makes connection to the p-side of the silicon (back contact). Further, contacts known as silver rear contacts, made out of silver or silver-aluminum paste are printed and fired on the N-side of silicon to enable soldering of tabs that electrically connect one cell to the next in a solar cell module. These contacts are the electrical outlets from the pn junction to the outside load.

The additives and glasses described herein provide heat to aluminum paste through exothermic reactions with aluminum which increase the wafer temperature during firing. The result is more uniform, reliable and efficient back contact. These additives also coat the Al particles, which upon firing, prevent the Al particles from sintering, thus reducing wafer bowing.

SUMMARY OF THE INVENTION

The invention describes a role certain organometallics and hydrocarbon resins play to improve the aluminum back contact to silicon solar cells. In particular, additives as well as organic resin additions increase firing temperature as well as uniformity of firing temperature in order to form a highly efficient solar cell contact. The cell improvements are reflected in reduced wafer bowing as well as improved cell efficiency (Eff), fill factor (FF), cell open circuit voltage, (Voc) and cell short circuit current, (Isc). Electrical performance of solar cells made therewith, as measured by low series resistance ($R_S$), high shunt resistance ($R_{sh}$) and high efficiency ($\eta$) are also facets of the invention.

In particular, an embodiment of the invention is a method of improving the electrical performance of an aluminum back contacted silicon solar cell, comprising: (a) providing a silicon wafer substrate (b) applying to the substrate a paste comprising (i) aluminum, (ii) an organometallic compound, and (iii) an organic hydrocarbon resin, to form a coated substrate, and (c) firing the coated substrate, wherein the organometallic compound is a $C_1$ to $C_{30}$ organometallic compound of a metal selected from the group consisting of Ag, Al, Ba, Bi, Ca, Co, Cr, Cu, Fe, K, Li, Mg, Mn, Mo, Na, Nd, Ni, Sb, Si, Sn, Sr, Ta, V, Zn, Zr, and combinations thereof, such that, together with the aluminum, the glass frit and organometallic compound forms a paste having an exothermic reaction peak, when measured with differential thermal analysis at a heating rate of 20° C. per minute in air, at a temperature of at least 300° C. to 660 C., with a sample size of 5 to 200 mg when run on a Mettler-Toledo TGA/SDTA 851e.

Another embodiment of the invention is a method of fondling a silicon solar cell comprising: (a) applying an aluminum paste on the back side of a silicon wafer having a p-type region, an n-region on top and a p-n junction, and (b) firing the surface provided with aluminum paste, whereby the wafer reaches a peak temperature of 700-900° C.

Still another embodiment of the invention is a solar cell comprising, prior to firing, (a) a silicon wafer substrate and (b) a paste applied to the substrate, the paste comprising: (i) aluminum, (ii) an organometallic compound, (iii) an organic resin, and (iv) and an organic vehicle, wherein the organometallic compound is a $C_1$ to $C_{30}$ organometallic compound of a metal selected from the group consisting of Al, Ag, Ba, Bi, Ca, Co, Cr, Cu, Fe, K, Li, Mg, Mn, Mo, Na, Nd, Ni, Sb, Si, Sn, Sr, Ta, V, Zn, Zr, and combinations thereof, such that, together with the aluminum, the glass frit and organic resin forms a paste having an exothermic reaction peak, when measured with differential thermal analysis at a heating rate of 20° C. per minute in air, at a temperature of at least 300° C. to less than 660° C., with a sample size of 5 to 200 mg when run on a Mettler-Toledo TGA/SDTA 851e, and wherein the combination of aluminum, organic vehicle and at least one organometallic compound is such that the sintering temperature of the paste is at least 5° C. lower than it would otherwise be if the at least organometallic compound was not present.

Yet another embodiment of the invention is a method of reducing the reaction temperature of a conductive paste sintering reaction, comprising: (a) providing a silicon wafer substrate (b) applying to the substrate a paste comprising (i) aluminum, (ii) an organometallic compound, (iii) an organic resin, to form a coated substrate, and (c) firing the coated substrate, wherein the organometallic compound is a $C_1$ to $C_{30}$ organometallic compound of a metal selected from the group consisting of Al, Ag, Ba, Bi, Ca, Co, Cr, Cu, Fe, K, Li, Mg, Mn, Mo, Na, Nd, Ni, Sb, Si, Sn, Sr, Ta, V, Zn, Zr, and combinations thereof, such that, together with the aluminum, the glass frit and organometallic compound forms a paste having an exothermic reaction peak, when measured with differential thermal analysis at a heating rate of 20° C. per minute in air, at a temperature of at least 300° C. to less than 660° C., with a sample size of 5 to 200 mg when run on a Mettler-Toledo TGA/SDTA 851e, and wherein the combination of aluminum, glass frit and at least one organometallic compound is such that the sintering temperature of the paste is at least 5° C. lower than it would otherwise be if the at least organometallic compound was not present.

Still another embodiment of the invention is a method of improving the electrical performance of an aluminum back contacted silicon solar cell, the method comprising: (a) providing a silicon wafer substrate; (b) providing a paste comprising: (i) aluminum, (ii) glass frit, and (iii) a separate and distinct amount of at least one organometallic compound, which, when fired, provides an exothermic enthalpy of 1 to 25 kilojoules (kJ) per gram of paste aluminum reacted at 700° C. to form a coated substrate, (c) applying the paste to the silicon wafer substrate to form a coated substrate, and (d) firing the coated substrate for a time and at a temperature sufficient to sinter the aluminum and fuse the glass frit and organometallic compound.

During crystalline silicon solar cell manufacturing, front silver based paste is applied to n-type silicon (phosphorus doped region) and aluminum back contact paste is applied to p-type (boron doped region) silicon. The back contact aluminum plays a key role in (1) improving the cell open circuit voltage, Voc; (2) in increasing the cell current by reducing the back contact recombination velocity, $S_{\mathit{eff}}$, by formation of a back surface field, BSF layer; and (3) also acts as a reflector for the unabsorbed light. All these factors lead to improvements in the overall cell efficiency. In solar cell manufacturing, front and back contact pastes are applied to the wafer (generally by screen printing) and dried. Both front contact silver and back contact aluminum pastes are co-fired at the same time in a belt furnace at 800° C. at very rapid rate (180-240 ipm) and the time at the peak firing temperature is of the order of 1-10 seconds.

The additives and resins described in this invention act as anti-sintering aids, reducing Al—Al sintering, thus leading to bow reduction in fired wafers. Besides bow reduction, these additives also provide heat to the aluminum paste through exothermic reactions which increase the wafer temperature in order to form more reliable and high efficiency front and back contacts. Higher and more uniform back contact temperature has following beneficial effects: (1) it increases the thickness of the BSF layer; (2) it increases the "doping" level of aluminum in the BSF layer; (3) it makes the wafer temperature more uniform and improves the temperature distribution in the wafer—heat generated by localized exothermic reaction is very effectively distributed by high thermal conductivity molten aluminum metal or aluminum alloys; (4) improves the aluminum paste adhesion to silicon and (5) improves the front contact formation. This control of temperature and its uniformity is critical for other types of back contacts also where aluminum is applied over thin coatings of $Al_2O_3$, $SiO_2$, $Si_3N_4$ or their combinations as a continuous film or where via openings are made to make aluminum silicon contact.

The inventors herein have determined, by the use of Differential Thermal Analysis (DTA), X-Ray diffraction study and (XRD) and Scanning Electron Microscopy (SEM) that molten aluminum reacts with the glass constituent, organometallic additive, and hydrocarbon resin additives. The heat is generated by the exothermic reaction between the glass, additives and molten aluminum. The effectiveness of various organometallics is calculated using the heats of reactions between the oxide and molten aluminum (for the back contact), between silicon and oxides for the front contacts, and removal of SiNx layer by calculating heats of reactions between $SiO_2$ and various organometallics.

The present invention involves addition of inorganic compounds or organometallic compounds or mixtures thereof that reacts exothermically with molten aluminum metals or aluminum-silicon alloy (including Al-silicon eutectic alloy) or other aluminum alloys on top of solar cell substrates during firing to make solar cell contacts.

The invention further involves addition of inorganic compounds or organometallic compounds, hydrocarbon resins or mixtures thereof that react exothermically with molten aluminum metals or aluminum-silicon alloy (including Al-silicon eutectic alloy) or other aluminum alloys in the temperature range of 300-660° C.

The invention demonstrates that certain organometallic compounds or combinations thereof in various forms, which upon reacting with molten aluminum metal during solar cell contact firing will provide excess heat which helps to form a better aluminum to silicon contact.

A mixing method where glass or mixture of glasses and/or oxide or mixtures of oxides and/or clays and/or silicate minerals (which are mixtures of various oxides) and/or pigments are well mixed with a sufficient amount of aluminum powder to have intimate contact between the reacting system i.e., aluminum and reactive additive. This mixture is added to the aluminum paste to generate uniform heat and improve aluminum paste contact properties.

The present invention provides an aluminum paste for application to a silicon solar cell having a p+ and n+ layer for the formation of a back-surface-field (BSF) and an emitter. Addition of various oxides to aluminum during firing provides additional heat to more thoroughly and uniformly sinter the contact.

The organometallic additions increase the silicon substrate temperature under given furnace set temperature and belt speed conditions as well as uniformity of substrate temperature in order to form a highly efficient solar cell contact. Electrical performance of solar cells made therewith, as measured by low series resistance ($R_S$) and high shunt resistance ($R_{sh}$) high efficiency ($\eta$) and high fill factor (FF), are also a facet of the invention.

The compositions and methods of the present invention overcome the drawbacks of the prior art by optimizing interaction, bonding, and contact formation between back contact (BSF) components, typically silicon with Al through a properly formulated aluminum paste. A conductive paste containing aluminum and a glass component is printed on a silicon substrate, and fired to fuse the glass, sinter the metal, and provide aluminum doping into the silicon wafer to a depth of several microns. Upon firing, one or more modifying organometallic compounds are added to the paste in order to initiate an exothermic reaction to form a back contact including a p+ layer, which is overlaid by an Al—Si eutectic layer, and which in turn is overlaid by aluminum layer.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

BRIEF DESCRIPTION OF THE DRAWINGS

FIG. 1: DTA of 8:1:1 Aluminum +Al monostearate +Vehicle 384.

DETAILED DESCRIPTION OF THE INVENTION

Broadly, the invention provides a solar cell comprising a contact. In particular, an embodiment of the invention is a method of improving the electrical performance of an aluminum back contacted silicon solar cell, comprising: (a) providing a silicon wafer substrate (b) applying to the substrate a paste comprising (i) aluminum, (ii) an organometallic compound, and (iii) an organic resin, to form a coated substrate, and (c) firing the coated substrate, wherein the organometallic compound is a $C_1$ to $C_{30}$ organometallic compound of a metal selected from the group consisting of Ag, Al, Ba, Bi, Ca, Co, Cr, Cu, Fe, K, Li, Mg, Mn, Mo, Na, Nd, Ni, Sb, Si, Sn, Sr, Ta, V, Zn, Zr, and combinations thereof, such that, together with the aluminum, the glass frit and organometallic compound forms a paste having an exothermic reaction peak, when measured with differential thermal analysis at a heating rate of 20° C. per minute in air, at a temperature of at least 300° C. to less than 660° C., with a sample size of 5 to 200 mg when run on a Mettler-Toledo TGA/SDTA 851e, (d) applying the paste to the silicon wafer substrate to form a coated substrate, and (e) firing the coated substrate for a time and at a temperature sufficient to sinter the aluminum and fuse the glass frit and organometallic compound.

Broadly, the invention provides a solar cell comprising a contact. The contact is made from a mixture wherein prior to firing, the mixture comprises at least one aluminum source, at least one boron source, and about 0.1 to about 10 wt % of a glass component. The content of aluminum is about 60 wt % to about 95 wt % of the mixture.

The aluminum back contact of a solar cell makes contact with both the silicon wafer and the Ag/Al rear contact layer. In a back contact, the metal component preferably comprises aluminum, and the glass component may be one of several types. Bismuth based glasses and alkali titanium silicate glasses each have certain advantages over the prior art when used in a solar cell back contact.

Broadly, thick film pastes containing aluminum and glass frit are used to make back contacts for silicon-based solar cells to conduct to an external load the current generated by exposure to light. While the paste is generally applied by screen-printing, methods such as extrusion, pad printing, ink jet printing, and hot melt printing may also be used. Further with suitable organics modifications the mixture of the present invention could be applied by tape lamination techniques, as taught in commonly owned U.S. Pat. No. 7,547,369. Solar cells with screen-printed front contacts are fired to relatively low temperatures (550° C. to 850° C. wafer temperature; furnace set temperatures of 650° C. to 1000° C.) to form a low resistance contact between the P-side of an aluminum doped silicon wafer and an aluminum based paste. Methods for making solar cells are also envisioned herein.

Aluminum- and glass-containing back contacts are used to form low resistance ohmic contacts on the back side of the solar cell due to large area melting and re solidification of Al doped ($p^+$) epitaxially grown Si layer which increases the solar cell performance due to the production of an improved back surface field. For optimum performance a thick $p^+$ re-grown region is believed to be ideal. It is also believed that the rejection of metallic impurities from the epitaxially growing $p^+$ layer leads to high carrier lifetimes. These two factors are believed to increase the open circuit voltage, and more importantly, the open circuit voltage falls only slightly as the bulk resistivity increases. Therefore solar cell performance improves due to the formation of a substantial epitaxially re-grown $p^+$ layer in the Al back contact.

During crystalline silicon solar cell manufacturing, front silver based paste is applied to n-type silicon (phosphorus doped region) and aluminum back contact paste is applied to p-type (boron doped region) silicon. The back contact aluminum plays a key role in (1) improving the cell open circuit voltage, Voc; (2) in increasing the cell current by reducing the back contact recombination velocity, $S_{eff}$, by formation of a back surface field, BSF layer; and (3) also acts as a reflector for the unabsorbed light. All these factors lead to improvements in the overall cell efficiency and other electrical parameters. In solar cell manufacturing, front and back contact pastes are applied to the wafer (generally by screen printing) and dried. Both front contact silver and back contact aluminum pastes are fired at the same time in a belt furnace at ca. 800° C. at very rapid rate (180-240 ipm) and the time at the peak firing temperature is of the order of only 1-10 seconds.

For a back contact, upon firing, a $p^+$ layer forms on the underlying silicon by liquid-phase epitaxy. This occurs during the resolidification of the aluminum-silicon (Al—Si) melt. High-bismuth lead-free and cadmium-free glasses allow low firing temperatures in making front contacts owing to their excellent flow characteristics relatively at low temperatures. Alkali-titanium-silicate glasses are another route to attain lower firing temperatures. While lead-glasses are often avoided for environmental reasons, they are sometimes used because they are the only route at present to certain properties, such as extremely low melting and wetting glasses. Relatively high-silicon, low bismuth lead-free and cadmium-free glasses provide suitable properties for back contacts, without excessive interaction with backside Si. Similarly, high-bismuth lead-free and cadmium-free glasses allow the formation of suitable lead-free silver rear contacts on backside Si with optimal interaction with both Si and back contact Al layer.

The additives and resins described in this invention act as anti-sintering aids, reducing Al—Al sintering, leading to bow reduction of the fired cells. Besides this, the additives also provide heat to the aluminum paste through exothermic reactions which increase the wafer temperature in order to form more reliable and high efficiency front and back contacts. Higher and more uniform back contact reaction temperature has following beneficial effects: (1) increases the thickness of the BSF layer; (2) increases the "doping" level of aluminum in the BSF layer; (3) makes the wafer temperature more uniform and improves the temperature distribution in the wafer—heat generated by localized exothermic reaction is very effectively distributed by high thermal conductivity molten aluminum metal or aluminum alloys; (4) improves the aluminum paste adhesion to silicon and (5) improves the front contact formation. This control of temperature and its uniformity is critical for other types of back contacts also where aluminum is applied over thin coatings of $Al_2O_3$, $SiO_2$, $Si_3N_4$ or their combinations as a continuous film or where via openings are made to make aluminum silicon contact.

The inventors herein have determined, by the use of Differential Thermal Analysis (DTA), X-Ray diffraction study and (XRD) and Scanning Electron Microscopy (SEM), the various parameters under which molten aluminum reacts with the glass constituent organometallic additive, and hydrocarbon resin additives. The heat is generated by the exothermic reaction between the glass, additives and molten aluminum. The effectiveness of various organometallics is calculated using the heats of reactions between the oxide and molten aluminum (for the back contact), between silicon and oxides for the front contacts, and removal of SiNx layer by calculating heats of reactions between $SiO_2$ and various organometallics.

The present invention involves addition of inorganic compounds or organometallic compounds or mixtures thereof that reacts exothermically with molten aluminum metals or aluminum-silicon alloy (including Al-silicon eutectic alloy) or other aluminum alloys on solar cell substrates during firing to make solar cell contacts.

The invention further involves addition of inorganic compounds or organometallic compounds, hydrocarbon resins or mixtures thereof that react exothermically with molten aluminum or aluminum-silicon alloy (including Al-silicon eutectic alloy) or other aluminum alloys in the temperature range of 550 to 950° C. or 650 to 850° C.

The invention demonstrates that certain organometallic compounds or combinations thereof in various forms, which upon reacting with molten aluminum metal during solar cell contact firing will provide excess heat which helps to form a better aluminum to silicon contact.

In general, addition of transition metal oxide organometallic compounds to an aluminum paste serves to generate heat. The oxides may come in the form of glass. Certain oxides such as cobalt oxide, manganese oxide, nickel oxide, iron oxide, silicon oxide, tin oxide, antimony oxide, silicon oxide, bismuth oxide, lead oxide, tin oxide or mixes their of with or without additional minerals or glasses are particularly advantageous. The oxides of bismuth, cobalt and vanadium have been found by the inventors to be particularly useful in this regard. Organometallic compounds such as metal acetylacetonates or metal acetates can serve the same purpose.

A mixing method is envisioned where glass or mixture of glasses and or oxide or mixtures of oxides and/or clays and/or silicate minerals (which are mixtures of various oxides) and/or pigments are well mixed with a sufficient amount of aluminum powder to have intimate contact between the reacting system i.e., aluminum and reactive additive. This mixture is added to the aluminum paste to generate uniform heat and improve aluminum paste contact properties.

The present invention provides an aluminum paste for application to a silicon solar cell having a p+ and n+ layer for the formation of a back-surface-field (BSF) and an emitter. Addition of various oxides to aluminum during firing provides additional heat to more thoroughly and uniformly sinter the contact.

The metal oxide additions increase firing temperature as well as uniformity of firing temperature in order to form a highly efficient solar cell contact. Electrical performance of solar cells made therewith, as measured by low series resistance ($R_S$) and high shunt resistance ($R_{sh}$) high efficiency ($\eta$) and high fill factor (FF), are also a facet of the invention.

Generally, the present invention includes a solar cell comprising a contact. The contact is made from a mixture wherein prior to firing, the mixture comprises at least one aluminum source, and about 0.1 to about 10 wt % of a glass component. The content of aluminum is about 60 wt % to about 95 wt % of the mixture.

The compositions and methods of the present invention overcome the drawbacks of the prior art by optimizing interaction, bonding, and contact formation between back contact (BSF) components, typically silicon with Al through a properly formulated aluminum paste. A conductive paste containing aluminum and a glass component is printed on a silicon substrate, and fired to fuse the glass, sinter the metal, and provide aluminum doping into the silicon wafer to a depth of several microns. One or more modifying oxides is added to the paste prior to firing in order to initiate an exothermic reaction to form a back contact including a p+ layer, which is overlaid by an Al—Si eutectic layer, and which in turn is overlaid by aluminum layer.

Broadly construed, the inventive pastes comprise aluminum, glass as well as a separate and distinct addition of an organometallic compound. Each ingredient is detailed hereinbelow.

Organometallics.

The invention demonstrates that certain organometallic compounds or combinations of organometallics, in various forms, which upon reacting with aluminum metal or glass frit during solar cell contact firing, will provide excess heat which helps to form a better aluminum to silicon contact.

Organometallic compounds having one or more metal centers, with one or more hydrocarbon chains (or hydrocarbon residues) each with 1 to 30 carbons, preferably 1 to 22, more preferably 1 to 18 carbons are useful. An organometallic compound may have 1, 2, 3, 4, 5, or 6 residues, which may be the same or different. Each hydrocarbon residue may have 1-5 carbons, 6-10 carbons, 11-15 carbons, 16-20 carbons, 21-25 carbons or 26-30 carbons. Alternatively each hydrocarbon residue may have 1-7 carbons, 8-12 carbons, 13-17 carbons, 18-22 carbons, 23-27 carbons or 28-30 carbons.

Other organic residues are possible, for example residues having one or more rings (such as biphenyl), or fused ring structures, such as naphthalene or anthracene. Heteroring systems including heteroatoms such as oxygen, nitrogen, sulfur, phosphorus, or silicon are envisioned. Stearates (monostearates, distearates, tristearates), acetates and acetylacetonates are especially useful. An organometallic compound useful herein may have organic residues with different carbon counts. By way of example only, an organometallic compounds including any of cobalt, manganese, nickel, iron, silicon, tin, antimony, bismuth, vanadium, strontium or combinations thereof with or without additional minerals or glasses are particularly advantageous. The organometallics of bismuth, cobalt and vanadium have been found by the inventors to be particularly useful in this regard. Metal acetylacetonates or metal acetates are preferred.

Envisioned herein is a mixing method where one or more glasses, oxides, clays, pigments or silicates are well mixed with a sufficient amount of aluminum powder to have intimate contact between the reagents. This mixture is added to the aluminum paste to generate uniform heat and improve aluminum paste contact properties.

The present invention also provides an aluminum paste for application to a silicon solar cell having a p+ and n+ layer for the formation of a back-surface-field (BSF) and an emitter. Addition of various oxides to aluminum during firing provides additional heat to more thoroughly and uniformly sinter the contact.

Metal Component. Solar cell contacts typically include silver, aluminum or both. In a back contact, the metal component comprises aluminum. The aluminum metal component may come in any suitable form, including aluminum metal powder, an alloy of aluminum, an aluminum salt, and organometallic aluminum, an oxide of aluminum, and an aluminum-containing glass. The aluminum particles used in the paste may be spherical, flaked, or provided in a colloidal suspension, and combinations of the foregoing may be used. In formulating the pastes, the metal powders typically have particle sizes of about 0.1 to about 40 microns, preferably less than 10 microns. For example the paste may comprise about 80 to about 99 wt % spherical aluminum particles or alternatively about 75 to about 90 wt % spherical aluminum particles and about 1 to about 10 wt % aluminum flakes. Alternatively the paste may comprise about 75 to about 90 wt % aluminum flakes and about 1 to about 10 wt % of colloidal aluminum, or about 60 to about 95 wt % of aluminum powder or aluminum flakes and about 0.1 to about 20 wt % of colloidal aluminum. The paste may also contain mixtures of fine Al powders and coarse Al powders. Suitable commercial examples of aluminum particles are available from Alcoa, Inc., Pittsburgh, Pa.; Ampal Inc., Flemington, N.J.; ECKA Granulate GmbH & Co. KG, of Fürth, Germany; and Goldsky, China, Jing Mao, China.

An alloy of aluminum may be used, including those comprising aluminum and another metal. Metals such as boron, silicon, gallium, indium, antimony, and magnesium are advantageous. In one embodiment, the alloy provides both aluminum and boron, namely, as an aluminum-boron alloy, which comprises about 60 to about 99.9 wt % aluminum and about 0.1 to about 40 wt % boron. In a preferred embodiment an aluminum-boron alloy containing 0.2 weight % B could be used for up to 98 wt % of the paste mixture to provide both aluminum and boron to the mixture. In yet another preferred embodiment, one or more of the alloys Al—Si, Al—Mg, Al—Ga, Al—In, Al—Sb, Al—Sn, and Al—Zn may constitute up to about 50 wt % of the mixture, preferably 0.1 to 40%, more preferably 0.2-30%.

The Al pastes herein can be used to form a p+ BSF several microns thick with an active peak doping concentration of about $10^{19}$ to about $10^{20}$ atoms per $cm^3$; that is, one or two orders of magnitude higher than is achievable with conventional Al paste (e.g., on the order of $10^{18}$ atoms per $cm^3$).

Glasses. The pastes comprise about 0.1 to about 10 wt %, preferably 0.2 to about 5 wt % of a glass component. The glass component comprises, prior to firing, one or more glass compositions. Each glass composition comprises oxide frits including, in one embodiment, $Bi_2O_3$, $B_2O_3$ and $SiO_2$. In another embodiment, the glass composition comprises an alkali oxide, $TiO_2$, and $SiO_2$. In particular, in various embodiments of the present invention, glass compositions for back contacts may be found in Tables 1-2. In formulating the pastes, the glass frits typically have particle sizes of about 0.5 to about 10 microns, although other particle sizes may be used as known in the art.

Looking to Tables 1-2, more than one glass composition can be used, and compositions comprising amounts from different columns in the same table are also envisioned. If a second glass composition is used, the proportions of the glass compositions can be varied to control the extent of paste interaction with silicon and hence the resultant solar cell properties, and to control the bowing of the silicon wafer. For example, within the glass component, the first and second glass compositions may be present in a weight ratio of about 1:20 to about 20:1, and preferably about 1:5 to about 5:1. The glass component preferably contains no lead or oxides of lead, and no cadmium or oxides of cadmium. However, in certain embodiments where the properties of PbO cannot be duplicated, such embodiments advantageously comprise PbO. An entry such as "$Li_2O+Na_2O+K_2O$" means that the total content of $Li_2O$ and $Na_2O$ and $K_2O$ falls within the specified ranges. For example, a range of 5-35 mol % ($Li_2O+Na_2O+K_2O$) includes 15-25 mol % $K_2O$, for example.

TABLE 1

Oxide frit ingredients for contact glasses in mole percent.

|  | Glass I | Glass II | Glass III | Glass IV |
|---|---|---|---|---|
| $Bi_2O_3$ | 20-55 | | | |
| $Al_2O_3$ | | | | 0.5-2.5 |
| $B_2O_3$ | 1-10 | 10-25 | | 10-30 |
| $K_2O$ | 10-35 | 0.5-3.0 | 5-15 | 0.2-2.0 |
| $Li_2O$ | | | 1-8 | |
| $Na_2O$ | | 0.01-3.0 | 16-28 | 5-15 |
| $P_2O_5$ | | | 0.2-8 | |
| $SiO_2$ | 10-50 | 70-90 | 30-50 | 16-26 |
| $TiO_2$ | | | 15-25 | 1-5 |
| $V_2O_5$ | | | 1-16 | |
| ZnO | | | | 21-31 |
| $ZrO_2$ | | | | 1-5 |
| $F_2$ | | | | 0.5-15 |

TABLE 2

Oxide frit ingredients for contact glasses in mole percent.

|  | A | B | C | D | E | F | G | H | I | J | K |
|---|---|---|---|---|---|---|---|---|---|---|---|
| $Bi_2O_3$ | 50-70 | 45-75 | 60-90 | 15-40 | 15-55 | 20-50 | 25-45 | 45-75 | 15-55 | 20-50 | 10-40 |
| $SiO_2$ | 25-45 | 20-40 | 10-30 | 25-60 | 15-55 | 20-50 | 25-45 | 20-40 | 15-55 | | 30-68 |
| ZnO | 2-7 | | | 5-15 | | | | | | 20-38 | |
| $B_2O_3$ | | | | 5-15 | | | | 5-15 | 1-15 | 10-25 | 5-15 |
| $Al_2O_3$ | | 5-15 | | | 1-15 | 2-12 | 3-10 | | | | |
| $V_2O_5$ | | | 1-10 | | | | | | | | |
| $Li_2O$ | | | | 5-15 | | | | | | | 1-10 |
| $Na_2O$ | | | | 0.5-5 | | | | | | | |
| $K_2O$ | | | | | | | | | | 0.1-15 | 1-10 |
| $Li_2O + Na_2O + K_2O$ | | | | | 5-35 | 10-30 | 15-25 | | 5-35 | | |
| $TiO_2$ | | | | | | | | | | | 0.1-5 |
| $Nb_2O_5$ | | | | 0.1-5 | | | | | | | |

Organic Resins.

Organic resins useful herein include tackifying resins, which, in turn, include rosin resins, terpene resins, hydrocarbon resins, and polymerized resins, i.e., hydrocarbon polymers. The degree of tack or "stickiness" of an adhesive tackifying resin can be quantified by the acid number (AN). As is known in the art, the acid number is expressed as the milligrams of KOH needed to neutralize a gram of sample, in accordance with ASTM D-465. Useful tackifying resins herein have acid numbers that range from about 0.1 to about 170. Certain useful tackifying resins have acid numbers from about 120 to about 170, while others have acid numbers of about 80 to about 120, and still others have acid numbers of about 0.1 to about 80. Tackifying resins are also described in terms of the softening temperature ($T_{sf}$). In order to reduce or eliminate the need for extreme heating of a tackifying resin prior to application and lamination, the most useful tackifying resins herein have softening temperatures of no more than about 150° C. The polymers or resins useful herein improve green strength of the paste and/or fill microporosities on a fired Al film to eliminate or reduce surface defects such as beads and reduce water reactivity at 70-85° C.

Rosin Resins.

Rosin resins are derived from three sources: gum rosin, wood rosin and tall oil rosin, all ultimately generated from the pine tree. Gum rosin is the oleoresin of the living pine tree. The most common rosin resin type used in adhesives is rosin esters, which are ideal to impart excellent, aggressive adhesion to almost all polymer types, including acrylates, natural rubber, ethylene-vinyl-acetate (EVA), styrene-butadiene-rubber (SBR), styrene-isoprene-styrene rubber (SIS), and styrene-butadiene-styrene rubber (SBS).

Useful rosin resins herein include those based on abietic acid, such as abietic type rosins, glycerol esters of abietic type rosins, pentaerythritol esters of abietic type rosins, methyl esters of abietic type rosins, pimaric type rosin, glycerol esters of pimaric type rosin, pentaerythritol ester of pimaric type rosins, methyl esters of pimaric type rosins, tall oil rosins, glycerol esters of tall oil rosins, pentaerythritol esters of tall oil rosins, methyl esters of tall oil rosins, fully or partially hydrogenated versions of all of the foregoing, and blends thereof.

In general, tackifying resins such as alpha methyl styrene resins, polyamide adhesive resins, polyterpene resins, polymerized rosin, rosin esters, styrenated terpene resins, tackifier dispersions and terpene-phenol resins are suitable. Suitable rosins include those sold by Arizona Chemical under the trade names Sylvalite®, Sylvatac® and Sylvagum®. Commercial examples include Sylvagum® RE 85K, a glycerol ester of tall oil resin having a Chemical Abstracts Service Registry Number of 8050-31-5; Sylvalite® RE 100L, a stabilized pentaerythritol ester of rosin (CASRN, 8050-26-8). Preferred tackifying resins include Eastman Abitol®-E (Dehydroabietyl Alcohol) having a softening temperature ($T_{sf}$) under 25° C., an acid number (AN) of 0.3, and CASRN of 133393-93-6. Wood rosins include Eastman Dymerex® polymerized wood rosin having AN about 130 to about 155 and a $T_{sf}$ of about 138° C. to about 151° C.; Arizona Chemical Sylvaros® PR R-85 polymerized wood rosin having AN of about 155 to about 162 and $T_{sf}$ about 79° C. to about 85° C.; Arizona Chemical Sylvaros® PR 140 polymerized wood rosin having AN of about 133 to about 147 and a $T_{sf}$ of about 135° C. to about 148° C. Each of the foregoing polymerized wood rosins has a CASRN of 65997-05-9.

Hydrocarbon Resins.

Major classifications of hydrocarbon resins include (a) aliphatic resins, based on C5 or dicyclopentadiene (DCPD) as raw materials; (b) aromatic resins, based on C9 aromatic components such as vinyltoluenes or indenes; and (c) combinations of C5/C9 feedstocks.

For example, a $C_5$ dienes crude mixture includes most importantly: Cyclopentadiene: 8-19%; Piperylene: 10-20%; Isoprene: 14-18%; and Dicyclopentadiene (DCPD): 0-5%. Resin grade DCPD includes Endo-DCPD: 73-83% and MethylDCPD: 7-13%. UPR Grade DCPD includes Endo-DCPD: 83-88% and MethylDCPD: 2-6%. High Purity DCPD includes Endo-DCPD: 90-95%. Resin Feed is a C9 mixture rich in indene and vinyltoluene, having Indene: 20-25%; Methylindenes: 5-15%; Vinyltoluenes: 15-25%; alpha-methylstyrene: 0-5%. Distilled Resin Oil is Redistilled, low naphthalene resin oil mixture having the following makeup: Indene: 21-27%; Methylindenes: 0-2%; Vinyltoluenes: 16-27%; alpha-methylstyrene: 0-5%. RO80 is C9 mixture rich in DCPD, indene and vinyltoluene and low in naphthalene and has the following makeup. DCPD: 40-55%; Indene: 3-10%; Methylindenes: 0-2%; Vinyltoluenes: 4-15%; and alpha-methylstyrene: 2-5%. The foregoing products are available from the Dow Chemical Company.

Hydrocarbon Resins sold by Eastman Chemical Company under the Kristalex® and Endex® trademarks include Kristalex® 3070, 3085, 3100, and 5140, and Endex® 155. The Kristalex products include low molecular weight alpha methyl styrene-styrene copolymers. Endex® and Kristalex® aromatic resins preferentially modify the styrenic endblocks of styrenic block copolymers and can be used to balance the cohesion, viscosity and temperature resistance of a pressure sensitive adhesive formulation.

Vehicle.

The pastes herein include a vehicle or carrier which is typically a solution of a thermoplastic resin dissolved in a solvent and, frequently, a solvent solution containing both resin and a thixotropic agent. The vehicle portion of the pastes comprises (a) at least about 80 wt % organic solvent; (b) up to about 15 wt % of a thermoplastic resin; (c) up to about 4 wt % of a thixotropic agent; and (d) up to about 2 wt % of a wetting agent. The use of more than one solvent, thermoplastic resin, thixotrope, and/or wetting agent is also envisioned. Although a variety of weight ratios of the solids portion to the organics portion are possible, one embodiment includes a weight ratio of the solids portion to the organics portion from about 20:1 to about 1:20, preferably about 15:1 to about 1:15, and more preferably about 10:1 to about 1:10.

Ethyl cellulose is a commonly used vehicle. However, Vehicles Such as Ethyl hydroxyethyl cellulose, wood rosin, mixtures of ethyl cellulose and phenolic compounds, polymethacrylates of lower alcohols and the monobutyl ether of ethylene glycol monoacetate can also be used. Solvents having boiling points (1 atm) from about 130° C. to about 350° C. are suitable. Widely used solvents include terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2,4-trimethyl-1,3-pentanediol monoisobutyrate), as well as other alcohol esters, kerosene, and dibutyl phthalate. The vehicle can contain organometallic compounds, for example those based on aluminum or boron, to modify the contact. N-Diffusol® is a stabilized liquid preparation containing an n-type diffusant with a diffusion coefficient similar to that of elemental phosphorus. Various combinations of these and other solvents can be formulated to obtain the desired viscosity and volatility requirements for each application. Other dispersants, surfactants and rheology modifiers, which are commonly used in thick film paste formulations, may be included. Commercial examples of such products include those sold under any of the following trademarks: Texanol® (Eastman Chemical Company, Kingsport, Tenn.); Dowanol® and Carbitol® (Dow Chemical Co., Midland, Mich.); Triton® (Union Carbide Division of Dow Chemical Co., Midland, Mich.), Thixatrol® (Elementis Company, Hightstown N.J.), and Diffusol® (Transene Co. Inc., Danvers, Mass.).

Among commonly used organic thixotropic agents is hydrogenated castor oil and derivatives thereof. A thixotrope is not always necessary because the solvent coupled with the shear thinning inherent in any suspension may alone be suitable in this regard. Furthermore, wetting agents may be employed such as fatty acid esters, e.g., N-tallow-1,3-diaminopropane di-oleate; N-tallow trimethylene diamine diacetate; N-coco trimethylene diamine, beta diamines;

N-oleyl trimethylene diamine; N-tallow trimethylene diamine; N-tallow trimethylene diamine dioleate, and combinations thereof.

Other Additives.

Other inorganic additives may be added to the paste to the extent of about 1 to about 30 wt %, preferably about 2 to about 25 wt % and more preferably about 5 to about 20 wt % based on the weight of the paste prior to firing. Other additives such as clays, fine silicon, silica, or carbon powder, or combinations thereof can be added to control the reactivity of the aluminum and boron with silicon. Common clays which have been calcined are suitable. Fine particles of low melting metal additives (i.e., elemental metallic additives as distinct from metal oxides) such as Pb, Bi, In, Ga, Sn, Sb, and Zn and alloys of each with at least one other metal can be added to provide a contact at a lower firing temperature, or to widen the firing window.

Paste Preparation.

The paste according to the present invention may be conveniently prepared on a planetary mixer. The amount and type of carriers utilized are determined mainly by the final desired formulation viscosity, fineness of grind of the paste, and the desired wet print thickness. In preparing compositions according to the present invention, the particulate inorganic solids are mixed with the vehicle and dispersed with suitable equipment, such as a planetary mixer or Hobart mixer, to form a suspension, resulting in a composition for which the viscosity will be in the range of about 100 to about 500 kcps, preferably about 300 to about 400 kcps, at a shear rate of 9.6 sec$^{-1}$ as determined on a Brookfield viscometer HBT, spindle 14, measured at 25° C.

Front contact silver pastes and back contact aluminum and back contact silver pastes are deposited and fired using a rapid thermal processing (RTP) furnace. Several methods are used to deposit front and back contact pastes. Back contact aluminum pastes are pad printed or screen printed with a thickness of about 15-30 microns. Typical firing cycle involves heating of solar cell in a RTP furnace such as Despatch Furnace (Ultraflex, Despatch Industries 8860 207th Street Minneapolis, Minn. 55044) where total firing cycle time is approximately 50-120 seconds using a travelling belt. The peak firing wafer temperature is about 750 to 830° C. for 1 to 20 seconds. Typically, solar cells are fired with silver side up and aluminum side facing the furnace belt and hence can lead to slight lower back side aluminum paste temperature due to rapid firing. Number of processing events occurs during the rapid firing of back contact aluminum paste. At lower temperature (<500° C.) solvents, organic binders and processing additives are removed by oxidation and formation of volatile products. Glass and other additives are also added to back contact aluminum pastes. Glass is expected to start softening above the glass transition temperature (Tg) of about 400-600° C. Aluminum powder particles (average size 1-30 microns) used in the back contact aluminum pastes have a native oxide layer (alumina Al2O3) present. The thickness (about 0.1-20 nanometers) and structure of the oxide layer depends on the thermal history of the powders and the powder manufacturing route. The thickness of the oxide layer increases with increasing the temperature and exothermic oxide formation reaction can be observed just before melting point of aluminum using Differential Thermal Analysis (DTA), The role of glass and additives in aluminum back contact is not well understood and/or explained in the literature. It is generally believed that the glass will interact with the $Al_2O_3$ layer on the aluminum powder and will also help to improve the paste adhesion to silicon substrate. As the paste temperature increases, the solubility of silicon in aluminum increases reaching about 1 wt % at 500° C. and silicon rapidly diffuses into aluminum but aluminum has very limited solubility in silicon. There are significant differences in the thermal coefficients of expansion (TCE) of $Al_2O_3$ layer (78×10$^{-7}$/° C.) and the molten aluminum metal (232×10$^{-7}$/° C.). The TCE differences lead to thermal stresses which in turn lead to rupture of $Al_2O_3$ layer at various locations to form a continuous network of molten aluminum. Above the melting point of aluminum of about 660° C., the molten aluminum dissolves significant amount of silicon from the substrate. The amount of silicon dissolve into molten aluminum depends on the aluminum-silicon alloy melt temperature. The amount of silicon dissolved into molten aluminum is about 20 wt % at about 700° C. and about 28 wt % at 800° C. The amount of silicon dissolved in the aluminum-silicon melt is thus a strong function of the aluminum-silicon alloy temperature which is determined by the silicon wafer temperature. The amount of silicon dissolved into silicon is critical in formation of back contact aluminum silicon contacts during subsequent cooling of the wafer. After reaching the peak firing temperature, the wafer is rapidly cooled. The solubility of the silicon in aluminum-silicon melt decreases with decrease in the wafer temperature. During cooling from the wafer maximum temperature to about 573° C., the excess silicon dissolved into the aluminum silicon melt is epitaxially deposited back on the silicon substrate to form a hyper eutectic silicon layer also know as Back Surface Field (BSF) layer. The BSF layer properties such as thickness and doping level of aluminum in the BSF layer are critical for improving the solar cell electrical properties. The thickness of the BSF layer (0.1-20 microns) and the doping of the BSF layer with aluminum (0.2 to 1×10$^{18}$ aluminum atoms/cm$^3$) is strongly dependent on the starting peak aluminum-silicon alloy temperature. At about 573° C., excess aluminum-silicon alloy melt freezes as a aluminum silicon eutectic alloy with about 11.7 wt % silicon. When the cooling melt reaches the Al—Si eutectic temperature the remaining liquid freezes as an Al—Si eutectic layer. A p+ layer is believed to provide a back surface field (BSF), which in turn increases the solar cell performance. Reliable and uniform contacts, thickness, and BSF electrical properties cannot be guaranteed because firing times are so short, (sometimes several seconds) and glass and metals have different heat capacities, and therefore heat at different rates. Solar cell electrical performance and adhesion between glass and metal in a contact could thus suffer. Hence a reliable method to heat the back contact is strongly desired to form high reliability, high electrical performance back aluminum contacts.

Method of Back Contact Production.

A solar cell back contact according to the present invention can be produced by applying any Al paste disclosed elsewhere herein, produced by mixing aluminum powders, boron containing materials, with the glass compositions of Tables 1 or 2 to the P-side of the silicon substrate pre-coated with silver rear contact paste, for example by screen printing, to a desired wet thickness, e.g., from about 30 to 50 microns. Front contact Ag pastes are then printed on the front side.

Common to the production of front contacts, back contacts and silver rear contacts is the following. Automatic screen-printing techniques can be employed using a 200-325 mesh screen. The printed pattern is then dried at 200° C. or less, preferably at about 120° C. for about 5-15 minutes before firing. The dry printed Al back contact paste of the present invention can be co-fired with the silver rear contact and the front contact silver pastes for as little as 1 second up to about 5 minutes at peak temperature, in a belt conveyor furnace in air.

Nitrogen ($N_2$) or another inert atmosphere may be used if desired, but it is not necessary. The firing is generally according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes are possible when firing at lower temperatures. For example a three-zone firing profile may be used, with a belt speed of about 1 to about 4 meters (40-160 inches) per minute. Naturally, firing arrangements having more than 3 zones are envisioned by the present invention, including 4, 5, 6, or 7, zones or more, each with zone lengths of about 5 to about 20 inches and firing temperatures of 650 to 1000° C.

EXAMPLES

Exemplary Al formulations in Table 3 were made with commercially available glasses from Ferro Corporation, Cleveland, Ohio. Commonly available 4-10 micron aluminum powders were used.

TABLE 3

Exemplary Aluminum-Exothermic Organometallic Paste Formulations (weight %)

| Formula | A | B | C |
|---|---|---|---|
| Ingredient | | | |
| Vehicle | 5.30 | 9.51 | 4.15 |
| V-425 Kristallex 3100 | | 1.00 | 1.98 |
| Texanol | 10.21 | 6.50 | 10.70 |
| AT 204 | 1.50 | 1.00 | 0.99 |
| Al stearate | 3.00 | 3.00 | 3.00 |
| Al powder (4-6 microns) | 76.39 | 76.39 | 76.39 |
| Glass I | 0.80 | 0.80 | 0.79 |
| Glass IV | 0.80 | 0.80 | 0.79 |
| Tin powder | 1.00 | 1.00 | 0.99 |
| Formula Filler | 1.00 | 1.00 | 1.00 |

Vehicle includes a high boiling solvent such as Texanol (80-90%) and a binder such as ethyl cellulose (10-20%). A small portion (1-5%) of a thixotropic agent may be included. Glass I has a formula (In mole %) of 35.8% $Bi_2O_3$, 35.5% $SiO_2$, 7.2% $B_2O_3$, 21.5% $K_2O$; Glass IV has a formula of 1.86% $Al_2O_3$; 20.86% $B_2O_3$; 0.75% $K_2O$; 10.43% $Na_2O$; 21.02% $SiO_2$; 3.16% $TiO_2$; 26.10% ZnO; 2.56% $ZrO_2$ and 13.26% F.

Prior art aluminum pastes (commercially available Ferro CN53-101) was fired side by side for comparison with pastes representing embodiments of the invention. All Al pastes were printed on 6 inch diameter (182 cm²) silicon polycrystalline wafers having a thickness of 200 microns, using 250 mesh screen. For front silver, NS 33-510 paste using a 325 mesh screen was printed. Photovoltaic cells were fired in a Despatch furnace using profile 400-400-500-700-800-920° C. @ 200 ipm. Electrical performance of some of these solar cells was measured with a solar tester, Model 91193-1000, Oriel Instrument Co., Stratford, Conn., under AM 1.5 sun conditions, in accordance with ASTM G-173-03. The electrical properties of the resultant solar cells are set forth in Table 4, which shows typical solar cell electrical properties and bowing for similar wafers for comparison of a prior art Al paste and an Al paste of the invention.

TABLE 4

Comparison of organometallic additive Al paste fired back contact with prior art Al back contact.

| Lot Name | Type of paste | PV_No | Jsc (A/cm2) | Isc (A) | Voc (V) | Bowing (mm) | Bow/Al wt (mm/g) |
|---|---|---|---|---|---|---|---|
| CN53-101 | Prior art | 5 | 0.03262 | 7.93693 | 0.61113 | 0.927 | 0.5638 |
| A | inventive | 9 | 0.03249 | 7.90563 | 0.6087 | 0.8 | 0.5395 |
| C | inventive | 4 | 0.03268 | 7.95174 | 0.61277 | 0.746 | 0.5206 |

Differential Thermal Analysis of several exemplary glass-metal compositions were run to determine the heat contribution of glasses or oxide additives to a glass-aluminum sintering reaction scheme. Sample sizes were typically about 5-200 mg. The peak position reveals whether the additive contributes heat before the melt point of aluminum is reached, (meaning it does not have an effect on the Al-glass reaction and does not assist in foaming a uniform contact), or after the melt point of aluminum is reached, meaning it contributes heat to the Al-glass reaction and assists in making a uniform contact. The results of selected DTA runs are summarized in Table 5.

TABLE 5

Highlights of select DTA runs for combinations of aluminum, organic resin and organometallic additives

| Products (wt ratio if given) | Sample Size (mg) | Peak Position (° C.) | Peak Area (sec * ° C.) | Temp Rise (° C.) |
|---|---|---|---|---|
| Al + Al monostearate + Veh 384 (8:1:1) | 6.23 | 358.42 625.45 | 114.47 48.82 | 131.37 35.1 |
| Al + Veh 384 (8:2) | 11.96 | 274.32 621.8 | 10.39 78.45 | 24.47 35.98 |
| Al monostearte + Veh 384 (8:2) | 6.54 | 413.57 601.37 | 32.72 73.73 | 21.04 33.54 |
| Al + Kristallex + Veh 384 (8:1:1) | 12.11 | 394.93 621.6 | 137.66 85.00 | 53.03 35.93 |
| Kristallex + Veh 384(1:1) | 12.45 | 409.64 | 1008.28 | 61.11 |
| Al + Dymerex + Veh 384 (8:1:1) | 12.28 | 408.29 542.52 621.55 | 70.74 65.92 61.42 | 89.65 42.73 30.84 |
| Dymerex + Veh 384 (8:2) | 15.30 | 416.33 533 | 333.58 90.07 | 71.01 37.53 |

Many solar cell manufacturers are now include water testing to distinguish supplier products. One water testing method is immersing a silicon wafer with a fired paste into deionized water and heated to a temperature of 70-85° C. for from 1 minute to 5 minutes. The wafer is observed for bubbling, indicating possible instability of the fired paste in water. A scale of 0-3 is applied with a 2 or 3 indicating failure in some cases.

The pastes herein were subjected to such a test, immersing a wafer with the indicated fired paste into deionized water for 5 minutes at 85° C. The scale is as follows: 0: no reaction at all (no surface bubbles); 1: slight surface bubbling, but no Al dissolution; 2: vigorous surface bubbling (no Al dissolution) and 3: vigorous surfacing bubbling with Al dissolution. For the inventive pastes herein (see table 4) the score for all were 1.

Additional advantages and modifications will readily occur to those skilled in the art. Therefore, the invention in its broader aspects is not limited to the specific details and illustrative example shown and described herein. Accordingly, various modifications may be made without departing from the spirit or scope of the general invention concept as defined by the appended claims and their equivalents.

The invention claimed is:

1. A method of forming an aluminum back contacted silicon solar cell having at least one of reduced bow and improved electrical performance, comprising:
   a. providing a silicon wafer substrate,
   b. providing a paste comprising:
      i. aluminum,
      ii. a glass fit, and
      iii. an organometallic compound, wherein the organometallic compound is an organic compound of a metal selected from the group consisting of cobalt, manganese, nickel, iron, silicon, tin, antimony, bismuth, vanadium, strontium and combinations thereof,
   c. applying the paste to the silicon wafer substrate to form a coated substrate, and
   d. firing the coated substrate for a time and at a temperature sufficient to sinter the aluminum together with the organometallic compound and fuse the glass frit.

2. The method of claim 1, wherein the organometallic compound is provided in the form of a compound having from 1 to 6 hydrocarbon residues, the residues independently having from 1 to 30 carbon atoms.

3. The method of claim 1, wherein the glass frit comprises
   a. 15-55 mol % $Bi_2O_3$,
   b. 15-55 mol % $SiO_2$,
   c. 1-15 mol % $B_2O_3$, and
   d. 5-35 mol % ($Li_2O+Na_2O+K_2O$).

4. The method of claim 1, wherein the glass frit comprises:
   a. 20-55 mol % $Bi_2O_3$,
   b. 10-35 mol % $K_2O$,
   c. 1-10 mol % $B_2O_3$ and
   d. 10-50 mol % $SiO_2$.

5. The method of claim 1, wherein the glass frit comprises:
   a. 10-25 mol % $B_2O_3$,
   b. 0.5-3 mol % $K_2O$,
   c. 0.01-3 mol % $Na_2O$, and
   d. 70-90 mol % $SiO_2$.

6. The method of claim 1, wherein the glass frit comprises:
   a. 5-15 mol % $K_2O$,
   b. 1-8 mol % $Li_2O$,
   c. 16-28 mol % $Na_2O$,
   d. 0.2-8 mol % $P_2O_5$,
   e. 30-50 mol % $SiO_2$,
   f. 15-35 mol % $TiO_2$, and
   g. 1-16 mol % $V_2O_5$.

7. The method of claim 1, wherein a sufficient amount of the organometallic compound is present in order to provide 100 ppmw to 10 wt % of the metal.

8. The method of claim 1, wherein a sufficient amount of the organometallic compound is present in order to provide 500 ppmw to 8 wt % of the metal.

9. The method of claim 1, wherein a sufficient amount of the organometallic compound is present in order to provide 1000 ppmw to 7 wt % of the metal.

10. The method of claim 1, wherein a sufficient amount of the organometallic compound is present in order to provide 0.05 wt % to 5 wt % of the metal.

11. The method of claim 1, wherein the aluminum metal is present in a proportion of 40-80 wt % of the entire paste.

* * * * *